United States Patent
Song et al.

(10) Patent No.: US 10,826,374 B2
(45) Date of Patent: Nov. 3, 2020

(54) CONTROL OF PULSE GENERATOR IN DRIVING CONTROL DEVICE

(71) Applicant: SEMICONDUCTOR COMPONENTS INDUSTRIES, LLC, Phoenix, AZ (US)

(72) Inventors: Kinam Song, Seoul (KR); Wonhi Oh, Bucheon (KR); Jinkyu Choi, Bucheon-si (KR); JunHo Lee, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/057,992

(22) Filed: Aug. 8, 2018

(65) Prior Publication Data
US 2020/0052572 A1 Feb. 13, 2020

(51) Int. Cl.
- *H02M 1/08* (2006.01)
- *H03K 3/037* (2006.01)
- *H02M 3/158* (2006.01)
- *H02M 1/00* (2006.01)

(52) U.S. Cl.
CPC ............. *H02M 1/08* (2013.01); *H02M 3/158* (2013.01); *H03K 3/037* (2013.01); *H02M 2001/0038* (2013.01); *H02M 2001/0041* (2013.01)

(58) Field of Classification Search
CPC . H02M 2001/0038; H02M 2001/0041; H02M 3/158; H02M 1/08; H03K 5/1534; H03K 5/1565; H03K 5/06; H03K 2005/00293; H03K 19/0185; H03K 19/018521; H03K 3/037; H03K 17/063
See application file for complete search history.

(56) References Cited

U.S. PATENT DOCUMENTS

| | | | | |
|---|---|---|---|---|
| 7,064,603 | B2* | 6/2006 | Sakata ................. | H03K 17/063 330/10 |
| 9,502,955 | B2* | 11/2016 | Ohashi .................... | H02M 1/08 |
| 2003/0048116 | A1* | 3/2003 | Suetsugu ............. | H03K 17/063 327/112 |
| 2014/0292392 | A1* | 10/2014 | Akahane ........ | H03K 19/018521 327/333 |
| 2015/0318855 | A1* | 11/2015 | Song .................. | H03K 19/0013 327/108 |

FOREIGN PATENT DOCUMENTS

JP     2010199787 A  *  9/2010  ............... H03K 5/04

* cited by examiner

*Primary Examiner* — Kyle J Moody
*Assistant Examiner* — Jye-June Lee
(74) *Attorney, Agent, or Firm* — AMPACC Law Group, PLLC

(57) ABSTRACT

A circuit for controlling a power converter includes a pulse generator generating a first pulse signal and a second pulse signal in response to an input signal, the first pulse signal being asserted at a given time interval or thereafter after the input signal has been de-asserted, a level-shift circuit shifting a level of the first pulse signal to generate a first shifted signal and to shift a level of the second pulse signal to generate a second shifted signal, a logic circuit controlling a first-side switching device in response to the first and second shifted signals, and an output node outputting an output signal. The first-side switching device is coupled to a second side-switching device at the output node.

20 Claims, 5 Drawing Sheets

CONTROL OF PULSE GENERATOR IN DRIVING CONTROL DEVICE

FIELD OF THE DISCLOSURE

The present disclosure relates generally to a circuit for controlling a power converter, and more particularly to driving control circuits used in power converters.

BACKGROUND

The present disclosure relates, in general, to electronics, and more particularly, to circuits and methods for controlling power switching devices used in power converters. Such circuits, for example, High-Voltage Integrated Circuits (HVICs), may drive one or more control terminals (e.g., gate terminals) of power switching devices.

An HVIC may receive an input signal and generates one or more control signals in response to the input signal, thereby controlling power switching devices based on the control signals. When an off-time duration of the input signal is relatively short, the HVIC may not assert one of the control signals in response to a rising edge of the input signal, resulting in a failure (that is, a latch off failure) of turning on a corresponding power switching device.

In order to address the above-described latch off failure of the HVIC, a conventional HVIC may include a pulse generator that generates two pulse signals in each cycle of the input signal, thereby asserting the one of the control signals in response to a second one of the two pulse signals even when the one of the control signals has not been asserted in response to a first one of the two pulse signals. However, such a conventional HVIC may increase power consumption.

BRIEF DESCRIPTION OF THE DRAWINGS

In the accompanying figures like reference numerals refer to identical or functionally similar elements throughout the separate views, together with the detailed description below, and are incorporated in and form part of the specification to further illustrate embodiments of concepts that include the claimed invention and explain various principles and advantages of those embodiments.

DETAILED DESCRIPTION

Figure 1:
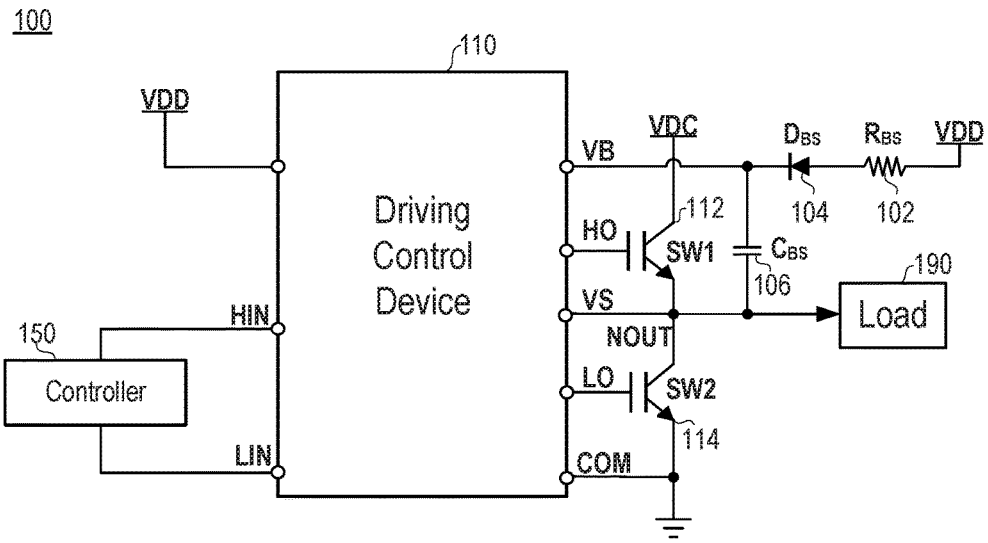
FIG. 1 illustrates a power converter according to an embodiment.

Embodiments relate to a circuit for controlling a power converter and a method of controlling the power converter.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Like reference numerals designate like elements in the specification.

In an embodiment, a circuit for controlling a power converter includes a pulse generator configured to generate a first pulse signal and a second pulse signal in response to an input signal, the first pulse signal being asserted at a given time interval or thereafter after the input signal has been de-asserted, a level-shift circuit configured to shift a level of the first pulse signal to generate a first shifted signal and to shift a level of the second pulse signal to generate a second shifted signal, a logic circuit configured to control a first-side switching device in response to the first and second shifted signals, and an output node configured to output an output signal. The first-side switching device is coupled to a second side-switching device at the output node.

In an embodiment, a circuit for controlling a power converter includes a pulse generator that generates a first pulse signal and a second pulse signal in response to an input signal, the first pulse signal being asserted at a given time interval or thereafter after the input signal has been de-asserted. As a result, such a driving control device according to an embodiment of the present disclosure may substantially prevent a latch off failure and reduce power consumption compared to a conventional driving control device.

FIG. 1 is a block diagram illustrating a power converter 100 according to an embodiment. The power converter 100 in FIG. 1 includes a driving control device 110, a controller 150, a first-side switching device 112, a second-side switching device 114, and a load 190. The power converter 100 in FIG. 1 further includes a resistor 102, a diode 104, and a capacitor 106, which function as a bootstrap circuit as will be described below in more detail with reference to FIG. 2.

The controller 150 in FIG. 1 generates a first input signal HIN to control the first-side switching device 112 and generates a second input signal LIN to control the second-side switching device 114. In an embodiment, the first input signal HIN and the second input signal LIN have substantially opposite phases to each other.

The driving control device 110 in FIG. 1 receives the first and second input signals HIN and LIN, and generates first and second control signals HO and LO in response to the first and second input signals HIN and LIN, respectively. In an embodiment, the driving control device 110 is a High-Voltage Integrated Circuit (HVIC).

In an embodiment, the driving control device 110 in FIG. 1 asserts the first control signal HO in response to a first edge (e.g., a rising edge) of the first input signal HIN and de-asserts the first control signal HO in response to a second edge (e.g., a falling edge) of the first input signal HIN. The driving control device 110 is connected to a first power supply VDD and a node between the diode 104 and the capacitor 106.

The first-side switching device 112 in FIG. 1 has a collector connected to a second power supply VDC, a gate receiving the first control signal HO, and an emitter connected to an output node NOUT. The second-side switching device 114 in FIG. 1 has a collector connected to the output node NOUT, a gate receiving the second control signal LO, and an emitter connected to a ground. In an embodiment, each of the first-side switching device 112 and the second-side switching device 114 is an insulated-gate bipolar transistor (IGBT), but embodiments of the present disclosure are not limited thereto.

The load 190 in FIG. 1 receives an output signal (e.g., an output voltage) VS through the output node NOUT. In an embodiment, the load 190 is an inductive load included in a power converter corresponding to a single-phase half-bridge circuit of a three-phase inverter in a motor application.

Figure 2:
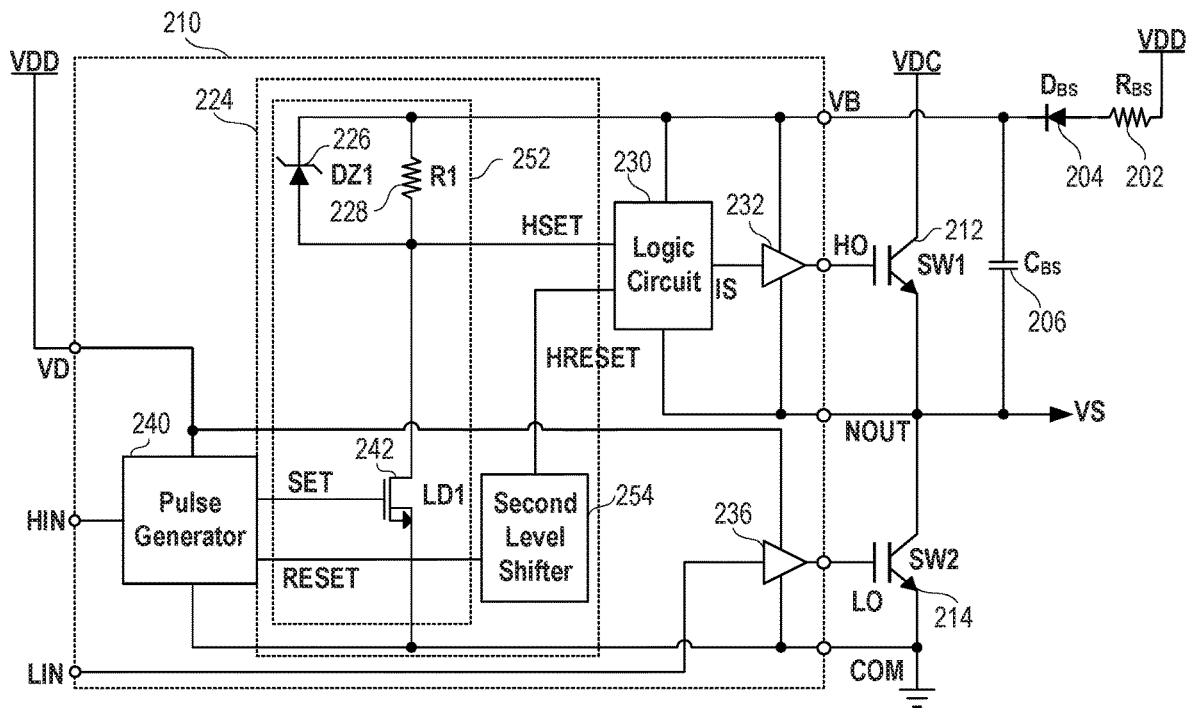
FIG. 2 illustrates a driving control device according to an embodiment.

FIG. 2 is a circuit diagram illustrating a driving control device 210 according to an embodiment. The driving control device 210 in FIG. 2 includes a pulse generator 240, a level shift circuit 224, a logic circuit 230, a first output driver 232, a second output driver 236, a first-side switching device 212, a second-side switching device 214, a resistor 202, a diode 204, and a capacitor 206.

The pulse generator 240 in FIG. 2 receives a first input signal HIN and generates a first pulse signal SET and a second pulse signal RESET in response to the first input signal HIN. In an embodiment, the pulse generator 240 generates the first pulse signal SET in response to a first edge (e.g., a rising edge) of the first input signal HIN and generates the second pulse signal RESET in response to a second edge (e.g., a falling edge) of the first input signal HIN.

The level shift circuit 224 in FIG. 2 includes a first level shifter 252 and a second level shifter 254. The first level shifter 252 in FIG. 2 inverts and shifts a level of the first pulse signal SET to generate a first shifted signal HSET.

The first level shifter 252 in FIG. 2 includes a switching device 242, a resistor 228, and a Zener diode 226. In an embodiment, the switching device 242 in FIG. 2 is a lateral double-diffused metal-oxide-semiconductor (LDMOS) transistor. The resistor 228 in FIG. 2 has a first end connected to a terminal receiving a voltage VB and a second end connected to a drain terminal of the switching device 242. The Zener diode 226 in FIG. 2 is connected to the resistor 228 in parallel, thereby clamping a level of a voltage across the resistor 228 not to exceed the Zener voltage of the Zener diode 226.

The second level shifter 254 in FIG. 2 inverts and shifts a level of the second pulse signal RESET to generate a second shifted signal HRESET. The second level shifter 254 in FIG. 2 has substantially the same configuration as the first level shifter 252, except that the first level shifter 252 receives the first pulse signal SET and outputs the first shifted signal HSET while the second level shifter 254 receives the second pulse signal RESET and outputs the second shifted signal HRESET.

The logic circuit 230 in FIG. 2 receives the first and second shifted signals HSET and HRESET and generates an intermediate signal IS. In an embodiment, the logic circuit 230 includes an RS flip-flop circuit (not shown) that receives the first shifted signal HSET as a set signal and the second shifted signal HRESET as a reset signal. For example, such an RS flip-flop circuit (not shown) asserts the intermediate signal IS in response to an inverted version of the first shifted signal HSET and de-asserts the intermediate signal IS in response to an inverted version of the second shifted signal HRESET.

In an embodiment, the logic circuit 230 in FIG. 2 further includes a noise cancellation circuit (not shown), a noise filter (not shown), or both, thereby substantially removing high frequency components of the first and second shifted signals HSET and HRESET. For example, a noise cancellation circuit, a noise filter, and an RS flip-flop circuit are sequentially connected to each other, so that the first and second shifted signals HSET and HRESET propagate through the noise cancellation circuit and the noise filter to a set input and a reset input of the RS flip-flop circuit, respectively.

The first output driver 232 in FIG. 2 amplifies the intermediate signal IS and outputs the amplified intermediate signal as a first control signal HO. The first-side switching device 212 in FIG. 2 has a control terminal (e.g., a gate) receiving the first control signal HO, a first terminal (e.g., a collector) connected to a second power supply VDC, and a second terminal (e.g., an emitter) connected to an output node NOUT.

The second output driver 236 in FIG. 2 amplifies a second input signal LIN and outputs the amplified second input signal as a second control signal LO. The second-side switching device 214 in FIG. 2 has a gate receiving the second control signal LO, a collector connected to the output node NOUT, and an emitter connected to a ground.

The capacitor 206 in FIG. 2 has a first end connected to the output node NOUT and a second end connected to a cathode of the diode 204. The second end of the capacitor 206 is also connected to the first level shifter 252, the logic circuit 230, and the first output driver 232. The resistor 202, the diode 204, and the capacitor 206 in FIG. 2 function as a bootstrap circuit that supplies a power voltage, using a first power supply VDD, to the first level shifter 252, the second level shifter 254, the logic circuit 230, and the first output driver 232. In an embodiment, the diode 204 is a high voltage diode that can block an inverse voltage applied thereto when the first-side switching device 212 is turned on to pull up the output voltage VS proximate to a level of a voltage VB at a node between the second end of the capacitor 206 and the cathode of the diode 204, the level of the second power supply VDC being higher than that of the first voltage supply VDD.

Figure 3:
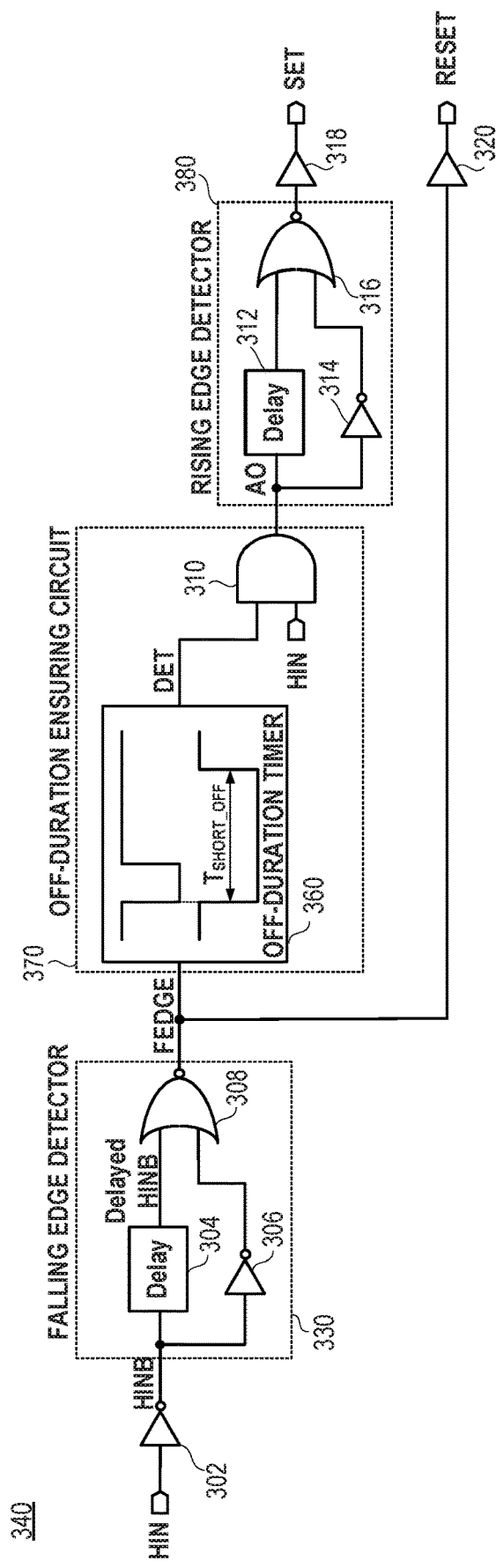
FIG. 3 illustrates a pulse generator according to an embodiment.

FIG. 3 is a block diagram illustrating a pulse generator 340 suitable for use as the pulse generator 240 of FIG. 2 according to an embodiment. The pulse generator 340 in FIG. 3 includes an inverter 302, a first edge detector (e.g., a falling edge detector) 330, an off-duration ensuring circuit 370, and a second edge detector (e.g., a rising edge detector) 380.

The inverter 302 in FIG. 3 receives a first input signal HIN and generates an inverted version HINB of the first input signal HIN. The falling edge detector 330 in FIG. 3 receives the inverted version HINB of the first input signal HIN and generates a signal (or a pulse signal) FEDGE corresponding to a falling edge of the first input signal HIN and having a given pulse width. In an embodiment, the falling edge detector 330 includes a delay element 304, an inverter 306, and a NOR gate 308. In such an embodiment, the pulse signal FEDGE is asserted when the first input signal HIN is de-asserted and the given pulse width is determined based on a delay amount of the delay element 304.

The off-duration ensuring circuit 370 in FIG. 3 includes an off-duration timer 360 and a logic gate (e.g., an AND gate) 310. The off-duration ensuring circuit 370 generates a modified input signal AO in response to the first input signal HIN and the pulse signal FEDGE.

The off-duration timer 360 in FIG. 3 de-asserts a detection signal DET in response to the pulse signal FEDGE, and then asserts the detection signal DET a given time interval $T_{SHORT\_OFF}$ after the detection signal DET has been de-asserted.

The AND gate 310 in FIG. 3 receives the detection signal DET and the first input signal HIN and performs logical AND operation on the detection signal DET and the first input signal HIN to generate the modified input signal AO.

As a result, the modified input signal AO has a logic high value when each of the detection signal DET and the first input signal HIN has a logic high value, and has a logic low value otherwise.

The rising edge detector 380 in FIG. 3 receives the modified input signal AO and generates a signal (or a pulse signal) corresponding to a rising edge of the modified input signal AO and having a given pulse width. In an embodiment, the rising edge detector 380 includes a delay element 312, an inverter 314, and a NOR gate 316. In such an embodiment, the pulse signal is asserted when the modified input signal AO is asserted and the given pulse width is determined based on a delay amount of the delay element 312.

The first buffer 318 in FIG. 3 amplifies an output signal of the rising edge detector 380 and outputs the amplified signal as a first pulse signal SET. The second buffer 320 in FIG. 3 amplifies the pulse signal FEDGE and outputs the amplified signal as a second pulse signal RESET.

Figure 4:
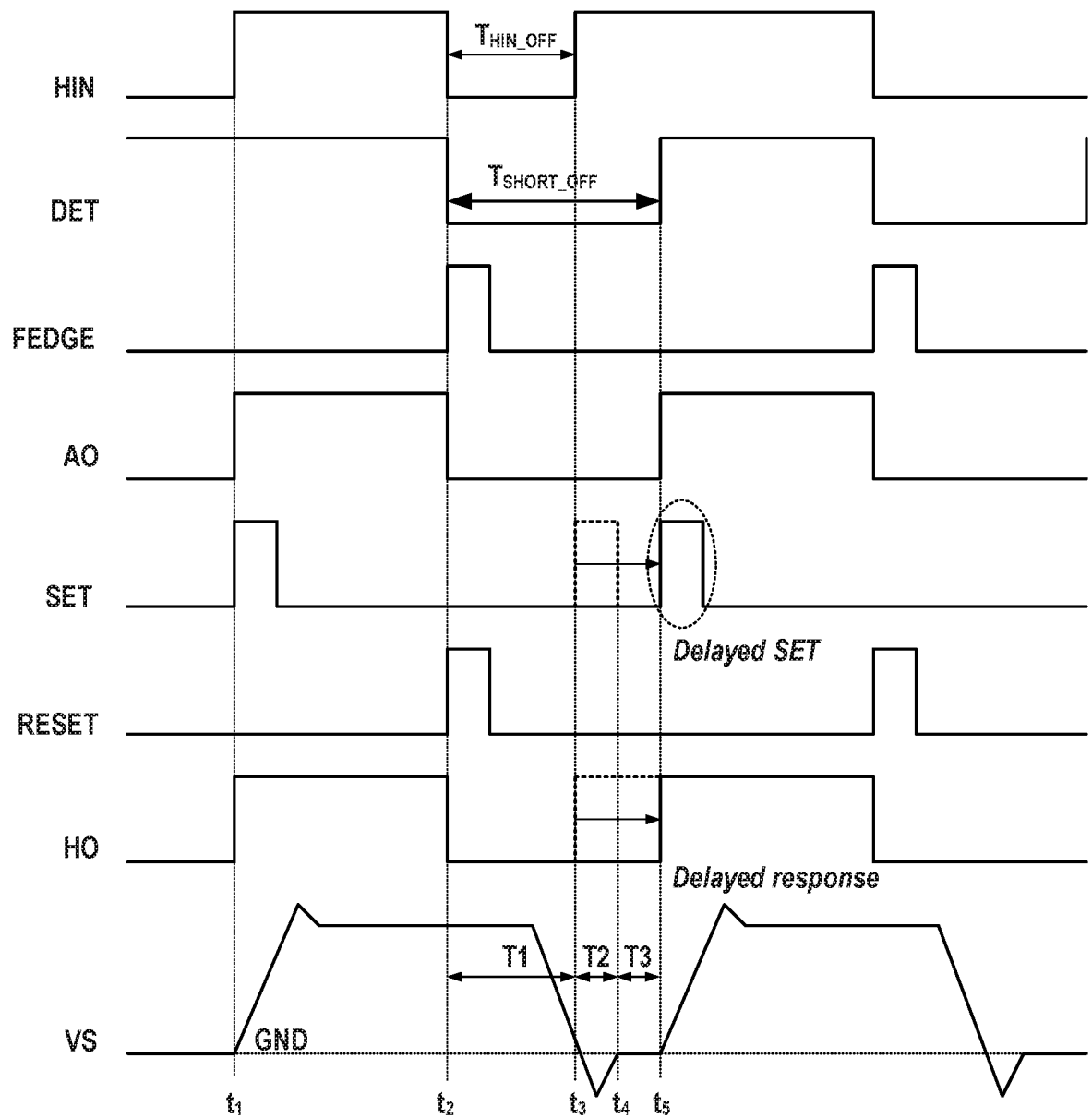
FIG. 4 includes waveforms illustrating operation of a driving control device that includes a pulse generator according to an embodiment.

FIG. 4 includes waveforms illustrating operation of a driving control device (e.g., the driving control device 210 in FIG. 2) that includes a pulse generator (e.g., the pulse generator 340 in FIG. 3) according to an embodiment. FIG. 4 includes waveforms of a first input signal HIN, a detection signal DET, a pulse signal FEDGE, a modified input signal AO, a first pulse signal SET, a second pulse signal RESET, a first control signal HO, and an output signal (or an output voltage) VS.

At a first time $t_1$, the first input signal HIN is asserted to transition from a first logic value (e.g., a logic low value) to a second logic value (e.g., a logic high value). Because the detection signal DET has been asserted before the first time $t_1$, the AND gate 310 in FIG. 3 generates the modified input signal AO having a logic high value. In response to a rising edge of the modified input signal AO, the rising edge detector 380 in FIG. 3 generates a pulse signal having a given pulse width, and the first buffer 318 in FIG. 3 generates the first pulse signal SET having a logic high value. As a result, the driving control device 210 in FIG. 2 generates the first control signal HO having a logic high value. The first-side switching device 212 in FIG. 2 is turned on in response to the first control signal, thereby increasing a level of the output voltage VS.

At a second time $t_2$, the first input signal HIN is de-asserted to transition from a logic high value to a logic low value. The falling edge detector 330 in FIG. 3 generates the pulse signal FEDGE having a given pulse width. In response to the pulse signal FEDGE, the off-duration timer 360 in FIG. 3 de-asserts the detection signal DET and keeps the detection signal DET having a logic low value for a given time interval $T_{SHORT\_OFF}$ (e.g., a time interval between the second time $t_2$ and a fifth time $t_5$ in FIG. 4). As a result, the AND gate 310 in FIG. 3 generates the modified input signal AO having a logic low value regardless of a value of the first input signal HIN for the given time interval $T_{SHORT\_OFF}$.

In response to the pulse signal FEDGE, the second buffer 320 in FIG. 3 generates the second pulse signal RESET having a logic high value. As a result, the first control signal HO is de-asserted to turn off the first-side switching device 212 in FIG. 2, thereby decreasing the level of the output voltage VS after a specific delay.

During a time interval T2 between a third time $t_3$ and a fourth time $t_4$, the first-side switching device 212 in FIG. 2 remains turned off and a current flows through a body diode (not shown) of the second-side switching device 214 in FIG. 2 into the output node NOUT in FIG. 2. As a result, the output voltage VS becomes negative and results in a negative undershoot. The time interval T2 may depend on one or more of a voltage drop of a body diode in a switching device (e.g., the second-side switching device 214 in FIG. 2), a parasitic inductance, and a resistance value of a shunt resistor connected to an end terminal of the switching device (e.g., an emitter of the second-side switching device 214 in FIG. 2) for sensing a switching current.

In a conventional driving control device without implementing a pulse generator (e.g., the pulse generator 340 in FIG. 3) according to an embodiment of the present disclosure, such a negative undershoot of the output voltage VS may result in a latch off failure when an off-time duration $T_{HIN\_OFF}$ of the first input signal HIN is relatively short. For example, when the first input signal HIN is asserted at the third time $t_3$, the first pulse signal SET (indicated by the dashed pulse in FIG. 4) in the conventional driving control device is asserted to have a logic high value at the third time $t_3$. In the conventional driving control device, a negative output voltage VS may cause a voltage VB at a node between a capacitor and a diode of a bootstrap circuit to be negative, thereby resulting in a negative voltage at a drain terminal of a switching device that receives the first pulse signal SET. Due to the negative voltage at the drain terminal, the switching device in the conventional driving control device may not be turned on even when a gate terminal of the switching device receives the first pulse signal SET having a logic high value, and thus the conventional driving control device may not generate the first control signal HO having a logic high value.

In contrast, a driving control device (e.g., the driving control device 210 in FIG. 2) according to an embodiment of the present disclosure implements a pulse generator (e.g., the pulse generator 340 in FIG. 3), which includes an off-duration ensuring circuit (e.g., the off-duration ensuring circuit 370 in FIG. 3). Such an off-duration ensuring circuit includes a timer circuit (e.g., the off-duration timer 360 in FIG. 3). When the off-time duration $T_{HIN\_OFF}$ of the first input signal HIN is shorter than the given time interval $T_{SHORT\_OFF}$, the off-duration timer 360 asserts the detection signal DET at the fifth time $t_5$ that is substantially a time at which the given time interval $T_{SHORT\_OFF}$ elapses after the detection signal DET has been de-asserted at the second time $t_2$. As a result, the AND gate 310 in FIG. 3 asserts the modified input signal AO, and the pulse generator 340 in FIG. 3 generates the first pulse signal SET having a logic high value at the fifth time $t_5$, rather than at the third time $t_3$. During a time interval T3 between a fourth time $t_4$ and the fifth time $t_5$, the output voltage VS is settled to a non-negative value (e.g., 0V) within a predetermined range and remains at the non-negative value. Because the time interval T2 when the output voltage VS is negative does not overlap with an on-time duration of the first pulse signal SET starting at the fifth time $t_5$, the driving control device 210 in FIG. 2 generate the first control signal HO having a logic high value in response to the first input signal HIN having a logic high value, thereby substantially preventing a latch off failure.

In addition, a pulse generator (e.g., the pulse generator 340 in FIG. 3) according to an embodiment of the present disclosure generates a single first pulse signal SET in each cycle of the first input signal HIN. Accordingly, a driving control device including the pulse generator according to an embodiment of the present disclosure may reduce power consumption compared to a conventional driving control device that includes a pulse generator generating two or more pulse signals in each cycle of an input signal.

In an embodiment, the given time interval $T_{SHORT\_OFF}$ is a predetermined time interval, which is determined based on one or more test results of a driving control device (e.g., the driving control device 210 in FIG. 2). The predetermined time interval $T_{SHORT\_OFF}$ is sufficiently long to avoid an overlap between an on-time duration of the first pulse signal SET and a time interval (e.g., the time interval T2 in FIG. 4) when the output voltage VS is negative between the third time $t_3$ and the fourth time $t_4$. In addition, the predetermined time interval $T_{SHORT\_OFF}$ is sufficiently short to avoid an excessive delay of the first pulse signal SET. For example, the predetermined time interval $T_{SHORT\_OFF}$ includes a first time interval T1, a second time interval T2, and a third time interval T3. In such an embodiment, the first time interval T1 and the second time interval T2 may be obtained from one or more test results, and the third time interval T3 between the fourth time $t_4$ and the fifth time $t_5$ is sufficiently long to prevent a latch off failure and sufficiently short to optimize efficiency of a system including the driving control device. For example, the third time interval T3 is equal to or shorter than 0.1%, 0.3%, 0.5%, 1%, 3%, 5%, 10%, 25%, or 50% of the second time interval T2 between the third time $t_3$ and the fourth time $t_4$. When a statistically significant number of tests are performed to obtain the first and second time intervals T1 and T2, the third time interval T3 is determined based on the test results such that an estimated percentage of an occurrence of a latch off failure is equal to or less than 5%, 3%, 1%, 0.5%, 0.3%, 0.1%, or 0.01%.

In an embodiment, the predetermined time interval $T_{SHORT\_OFF}$ further includes a time interval (not shown) corresponding to a propagation delay of the first input signal HIN through a driving control device (e.g., the driving control device 210 in FIG. 2). For example, the predetermined time interval $T_{SHORT\_OFF}$ further includes a propagation delay between a falling edge of the first input signal HIN and a falling edge of the first control signal HO in FIG. 2.

Although not shown, when the off-time duration $T_{HIN\_OFF}$ of the first input signal HIN is equal to or longer than the given time interval $T_{SHORT\_OFF}$, a pulse generator (e.g., the pulse generator 340 in FIG. 3) according to an embodiment of the present disclosure asserts the first pulse signal SET at a time (not shown) in response to a rising edge of the first input signal HIN.

Figure 5:
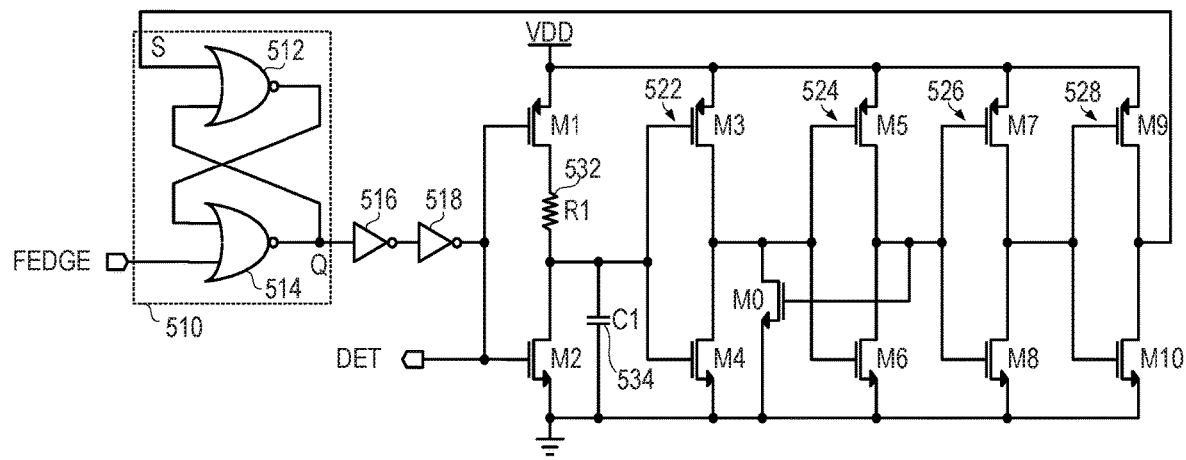
FIG. 5 illustrates an off-duration timer suitable for use in an off-duration ensuring circuit according to an embodiment.

FIG. 5 illustrates an off-duration timer 560 suitable for use as the off-duration timer 360 in FIG. 3 according to an embodiment. The off-duration timer 560 in FIG. 5 includes a latch circuit (e.g., a NOR latch) 510, first and second inverting devices 516 and 518, a first PMOS transistor M1, a first NMOS transistor M2, a resistor 532, a capacitor 534, a first inverter 522, a second inverter 524, a third inverter 526, and a fourth inverter 528. The first inverter 522 includes a second PMOS transistor M3 and a second NMOS transistor M4, the second inverter 524 includes a third PMOS transistor M5 and a third NMOS transistor M6, the third inverter 526 includes a fourth PMOS transistor M7 and a fourth NMOS transistor M8, and the fourth inverter 528 includes a fifth PMOS transistor M9 and a fifth NMOS transistor M10. The off-duration timer 560A in FIG. 5 further includes a sixth NMOS transistor M0 having a drain terminal connected to an output line of the first inverter 522 and an input line of the second inverter 524, a gate terminal connected to an output line of the second inverter 524, and a source connected to a ground.

The off-duration timer 560 in FIG. 5 receives a signal FEDGE (e.g., the pulse signal FEDGE in FIG. 3) corresponding to a falling edge of an input signal (e.g., the first input signal HIN in FIG. 3) and a detection signal DET (e.g., the detection signal DET in FIG. 3), de-asserts the detection signal DET in response to the pulse signal FEDGE, and asserts the detection signal DET at a given time interval (e.g., the given time interval $T_{SHORT\_OFF}$ in FIG. 3) after the detection signal DET has been de-asserted. When a threshold voltage of the first inverter 522 in FIG. 5 is substantially equal to half of a power supply voltage VDD, the given time interval is represented by the following equation:

$$T_{SHORT\_OFF} \cong 0.693 * R1 * C1 \qquad \text{Equation 1.}$$

In Equation 1, $T_{SHORT\_OFF}$ is a predetermined time interval, R1 is the resistance of the resistor 532, and C1 is the capacitance of the capacitor 534.

Figure 6:
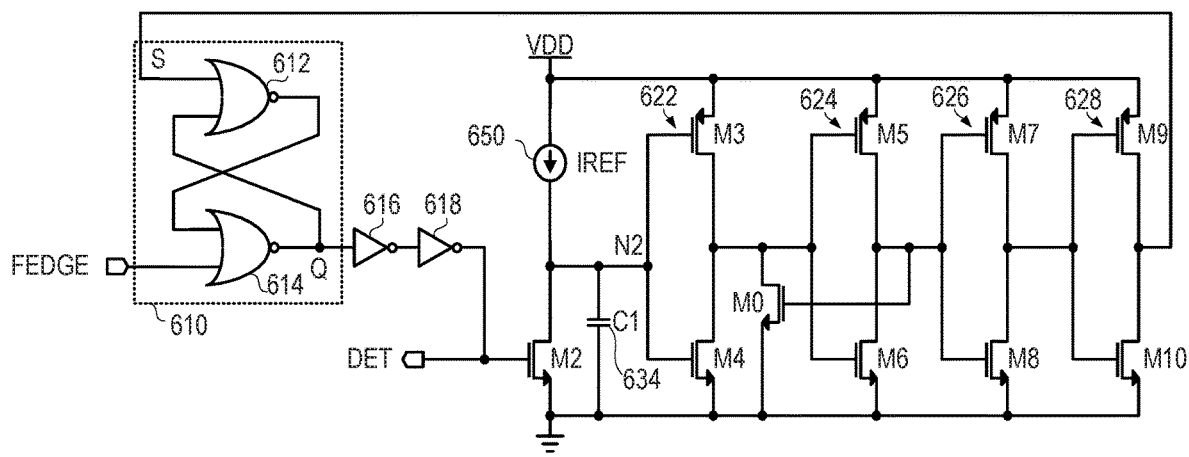
FIG. 6 illustrates an off-duration timer suitable for use in an off-duration ensuring circuit according to another embodiment.

FIG. 6 illustrates an off-duration timer 660 suitable for use as the off-duration timer 360 in FIG. 3 according to an embodiment. The off-duration timer 660 in FIG. 6 includes a latch circuit (e.g., a NOR latch) 610, first and second inverting devices 616 and 618, a current source 650, a first NMOS transistor M2, a capacitor 634, a first inverter 622, a second inverter 624, a third inverter 626, and a fourth inverter 628. The first inverter 622 includes a first PMOS transistor M3 and a second NMOS transistor M4, the second inverter 624 includes a second PMOS transistor M5 and a third NMOS transistor M6, the third inverter 626 includes a third PMOS transistor M7 and a fourth NMOS transistor M8, and the fourth inverter 628 includes a fourth PMOS transistor M9 and a fifth NMOS transistor M10. The off-duration timer 660 in FIG. 6 further includes a sixth NMOS transistor M0 having a drain terminal connected to an output line of the first inverter 622 and an input line of the second inverter 624, a gate terminal connected to an output line of the second inverter 624, and a source connected to a ground.

The off-duration timer 660 in FIG. 6 receives a signal FEDGE (e.g., the pulse signal FEDGE in FIG. 3) corresponding to a falling edge of an input signal (e.g., the first input signal HIN in FIG. 3) and a detection signal DET (e.g., the detection signal DET in FIG. 3), de-asserts the detection signal DET in response to the pulse signal FEDGE, and asserts the detection signal DET at a given time interval (e.g., the given time interval $T_{SHORT\_OFF}$ in FIG. 3) after the detection signal DET has been de-asserted. When a threshold voltage of the first inverter 622 in FIG. 6 is substantially equal to half of a power supply voltage VDD, the given time interval is represented by the following equation:

$$T_{SHORT\_OFF} \cong C1 * \frac{VDD}{2} * \frac{1}{IREF}. \qquad \text{Equation 2}$$

In Equation 2, $T_{SHORT\_OFF}$ is a predetermined time interval, C1 is the capacitance of the capacitor 634, and IREF is the current generated by the current source 650.

Figure 7:
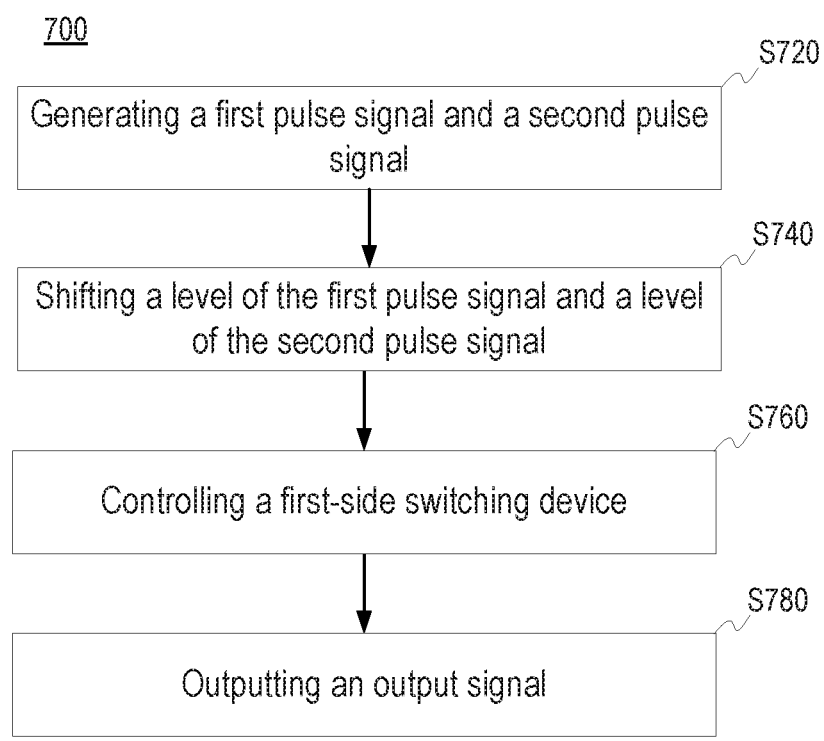
FIG. 7 illustrates a process performed by a driving control device according to an embodiment.

FIG. 7 illustrates a process 700 performed by a driving control device (e.g., the driving control device 210 in FIG. 2) according to an embodiment. In an embodiment, the driving control device includes a pulse generator (e.g., the pulse generator 240 in FIG. 2), a level-shift circuit (e.g., the level-shift circuit 224 in FIG. 2), a logic circuit (e.g., the logic circuit 230 in FIG. 2), and an output node (e.g., the output node NOUT in FIG. 2).

At S720, the pulse generator generates a first pulse signal (e.g., the first pulse signal SET in FIG. 2) and a second pulse signal (e.g., the second pulse signal RESET in FIG. 2) in response to an input signal (e.g., the first input signal HIN in FIG. 2). In an embodiment, the first signal is asserted at a given time interval (e.g., the given time interval $T_{SHORT\_OFF}$ in FIG. 3) or thereafter after the input signal has been de-asserted. For example, when an off-time duration of the input signal is shorter than the given time interval, the pulse generator asserts the first signal at a first time when the given time interval elapses after the input signal has been de-asserted. When the off-time duration of the input signal is equal to or longer than the given time interval, the pulse generator asserts the input signal at a second time in response to an edge of the input signal, the second time being the same as or subsequent to the first time.

At S740, the level shift circuit shifts a level of the first pulse signal to generate a first shifted signal (e.g., the first shifted signal HSET in FIG. 2) and shifting a level of the second pulse signal to generate a second shifted signal (e.g., the second shifted signal HRESET in FIG. 2).

At S760, the logic circuit controls a first-side switching device (e.g., the first-side switching device 212 in FIG. 2) in response to the first and second shifted signals.

At S780, the output node outputs an output signal (e.g., the output voltage VS in FIG. 2). In an embodiment, the first switching device and a second side-switching device (e.g., the second side-switching device 214 in FIG. 2) are coupled to each other at the output node.

Embodiments of the present disclosure include electronic devices, e.g., one or more packaged semiconductor devices, configured to perform one or more of the operations described herein. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined.

What is claimed is:

1. A circuit for controlling a power converter, the circuit comprising:
   a pulse generator configured to generate a first pulse signal and a second pulse signal in response to an input signal, the first pulse signal being asserted at least a given time interval after the input signal has been de-asserted, the pulse generator outputting a single pulse signal in each cycle of the input signal to turn on a first-side switching device;
   a level-shift circuit configured to shift a level of the first pulse signal to generate a first shifted signal and to shift a level of the second pulse signal to generate a second shifted signal;
   a logic circuit configured to control the first-side switching device in response to the first shifted signal and the second shifted signal; and
   an output node configured to output an output signal,
   wherein the first-side switching device is coupled to a second side-switching device at the output node, and the given time interval includes a first time interval when the output signal has a negative value, the given time interval being sufficiently long to avoid an overlap between the first time interval and an on-time duration of the first pulse signal.

2. The circuit of claim 1, wherein the pulse generator asserts the first pulse signal at a first time when an off-time duration of the input signal is shorter than the given time interval, the first time being a time at which the given time interval elapses after the input signal has been de-asserted.

3. The circuit of claim 2, wherein the pulse generator asserts the first pulse signal at a second time in response to an edge of the input signal when the off-time duration of the input signal is equal to or longer than the given time interval.

4. The circuit of claim 2, wherein the pulse generator includes:
   an off-duration ensuring circuit generating a modified input signal in response to a third pulse signal corresponding to an edge of the input signal; and
   a first edge detector generating the first pulse signal in response to the modified input signal.

5. The circuit of claim 4, wherein the off-duration ensuring circuit includes:
   an off-duration timer de-asserting a detection signal in response to the third pulse signal and asserting the detection signal at a time at which the given time interval elapses after the detection signal has been de-asserted; and
   a logic gate generating the modified input signal in response to the detection signal and the input signal.

6. The circuit of claim 5, wherein the off-duration timer includes:
   a resistor;
   a latch circuit receiving the third pulse signal as a reset signal;
   a first transistor having a source coupled to a power supply voltage, a gate coupled to the latch circuit, and a drain coupled to a first end of the resistor;
   a second transistor having a source coupled to a ground, a gate receiving the detection signal, and a drain coupled to a second end of the resistor; and
   a capacitor having a first end coupled to an input line of an inverter and a second end coupled to the ground.

7. The circuit of claim 5, wherein the off-duration timer includes:
   a current source;
   a latch circuit receiving the third pulse signal as a reset signal;
   a transistor having a source coupled to a ground, a gate receiving the detection signal, and a drain coupled to the current source; and
   a capacitor having a first end coupled to an input line of an inverter and a second end coupled to the ground.

8. The circuit of claim 4, wherein the pulse generator further includes:
   a second edge detector generating the third pulse signal in response to an inverted version of the input signal.

9. The circuit of claim 1, wherein the given time interval further includes a second time interval when the output signal is settled to have a non-negative value, the second time interval being determined to make an estimated percentage of an occurrence of a latch off failure equal to or less than 5%, 3%, 1%, 0.5%, 0.3%, 0.1%, or 0.01%.

10. The circuit of claim 1, wherein the given time interval further includes a second time interval when the output signal is settled to have a non-negative value, the second time interval immediately following the first time interval and being equal to or shorter than 0.1%, 0.3%, 0.5%, 1%, 3%, 5%, 10%, 25%, or 50% of the first time interval.

11. The circuit of claim 1, wherein the given time interval starts when the input signal is de-asserted.

12. A method of controlling a power converter, the method comprising:
   generating a first pulse signal and a second pulse signal in response to an input signal, the first pulse signal being asserted at least a given time interval after the input signal has been de-asserted, the first pulse signal being a single pulse signal in each cycle of the input signal;

shifting a level of the first pulse signal to generate a first shifted signal and shifting a level of the second pulse signal to generate a second shifted signal;

controlling a first-side switching device in response to the first shifted signal and the second shifted signal; and outputting an output signal at an output node, wherein the first-side switching device and a second-side switching device are coupled to each other at the output node, and the given time interval includes a first time interval when the output signal has a negative value and a second time interval when the output signal is settled to have a non-negative value, the given time interval being sufficiently long to avoid an overlap between the first time interval and an on-time duration of the first pulse signal, the second time interval being determined to make an estimated percentage of an occurrence of a latch off failure equal to or less than 5%, 3%, 1%, 0.5%, 0.3%, 0.1%, or 0.01%.

13. The method of claim 12, further comprising:

asserting the first pulse signal at a first time when an off-time duration of the input signal is shorter than the given time interval, the first time being a time at which the given time interval elapses after the input signal has been de-asserted.

14. The method of claim 13, further comprising:

asserting the first pulse signal at a second time in response to an edge of the input signal when the off-time duration of the input signal is equal to or longer than the given time interval.

15. The circuit of claim 13, further comprising:

generating a modified input signal in response to a third pulse signal corresponding to an edge of the input signal; and generating the first pulse signal in response to the modified input signal.

16. The method of claim 15, further comprising de-asserting a detection signal in response to the third pulse signal and asserting the detection signal at a time at which the given time interval elapses after the detection signal has been de-asserted, wherein the modified input signal is generated in response to the detection signal and the input signal.

17. The method of claim 15, further comprising:

generating the third pulse signal in response to an inverted version of the input signal.

18. A power converter comprising:

a first-side switching device;

a second-side switching device coupled to the first-side switching device at an output node, the output node outputting an output signal;

a controller configured to generate first and second input signals; and a driving control device configured to generate a first control signal in response to the first input signal to control the first-side switching device and a second control signal in response to the second input signal to control the second-side switching device, wherein the driving control device includes a pulse generator configured to generate a first pulse signal and a second pulse signal in response to the first input signal, the first pulse signal being asserted at least a given time interval after the first input signal has been de-asserted, the given time interval including a first time interval when the output signal has a negative value, the given time interval being sufficiently long to avoid an overlap between the first time interval and an on-time duration of the first pulse signal, the pulse generator being further configured to output a single pulse signal in each cycle of the input signal to turn on the first-side switching device.

19. The power converter of claim 18, wherein the pulse generator asserts the first pulse signal at a first time when an off-time duration of the first input signal is shorter than the given time interval, the first time being a time at which the given time interval elapses after the input signal has been de-asserted.

20. The power converter of claim 18, wherein the given time interval further includes a second time interval when the output signal is settled to have a non-negative value, the second time interval immediately following the first time interval and being equal to or shorter than 0.1%, 0.3%, 0.5%, 1%, 3%, 5%, 10%, 25%, or 50% of the first time interval.

* * * * *